(12) United States Patent
Halligan et al.

(10) Patent No.: US 11,754,605 B2
(45) Date of Patent: Sep. 12, 2023

(54) SERIES TEE SPLITTER FOR IMPEDANCE MEASUREMENTS

(71) Applicant: National Technology & Engineering Solutions of Sandia, LLC, Albuquerque, NM (US)

(72) Inventors: Matthew Halligan, O'Fallon, MO (US); Tyler Bowman, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 2 days.

(21) Appl. No.: 17/479,265

(22) Filed: Sep. 20, 2021

(65) Prior Publication Data

US 2022/0099720 A1 Mar. 31, 2022

Related U.S. Application Data

(60) Provisional application No. 63/084,721, filed on Sep. 29, 2020.

(51) Int. Cl.
*G01R 27/16* (2006.01)
*H01R 9/05* (2006.01)

(52) U.S. Cl.
CPC ............ *G01R 27/16* (2013.01); *H01R 9/05* (2013.01); *H01R 2201/20* (2013.01)

(58) Field of Classification Search
CPC ...... G01R 27/16; G01R 27/025; G01R 27/32; G01R 27/04; H01R 9/05; H01R 2201/20; H01R 24/547
See application file for complete search history.

(56) References Cited

U.S. PATENT DOCUMENTS

| 2,826,743 A | 3/1958 | Ellis |
| 5,627,476 A * | 5/1997 | Chambers ............... G01R 27/16 324/649 |
| 7,679,567 B2 | 3/2010 | Azhari |
| 10,333,222 B2 | 6/2019 | Kim et al. |
| 2013/0214762 A1* | 8/2013 | Leibfritz ................. G01R 27/04 324/98 |
| 2017/0256842 A1* | 9/2017 | Hershberger .......... H01Q 21/22 |
| 2018/0174735 A1* | 6/2018 | Outaleb ................. H01P 5/028 |
| 2019/0086503 A1* | 3/2019 | Simpson .............. G01R 35/005 |
| 2021/0159610 A1* | 5/2021 | Manesh .................. G01S 7/025 |

\* cited by examiner

*Primary Examiner* — Akm Zakaria
(74) *Attorney, Agent, or Firm* — Kevin W. Bieg

(57) ABSTRACT

A series tee splitter comprises a primary electromagnetic transmission line and a secondary electromagnetic transmission line that is placed in a series path with the primary electromagnetic transmission line, wherein a load is attached to the end of the secondary electromagnetic transmission line and a network analyzer is connected to opposite ends of the primary electromagnetic transmission line to measure a load impedance. This configuration increases the high impedance measurement limit of the network analyzer normally seen for reflection measurements. The series tee splitter can be electrically small to provide broadband impedance information.

8 Claims, 12 Drawing Sheets

SERIES TEE SPLITTER FOR IMPEDANCE MEASUREMENTS

CROSS-REFERENCE TO RELATED APPLICATION

This application claims the benefit of U.S. Provisional Application No. 63/084,721, filed Sep. 29, 2020, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to electrical impedance measurements and, in particular, to a series tee splitter for impedance measurements.

BACKGROUND OF THE INVENTION

Broadband impedance measurements can be used to develop circuit models and behavioral models for power system components to determine how they respond to a high-altitude electromagnetic pulse (HEMP) event from the early-time to the late-time portions of the event. During component susceptibility testing, device transient response measurements can be compared with device models to ensure measurement and modeling corroboration. In addition, device impedance measurements can also be used as a state-of-health metric before and after susceptibility tests, where a change in device impedance may indicate component damage. Many power systems devices of interest are high impedance components. Some component examples include insulators, surge arresters, delta-configured transformers, digital protective relays, and potential transformers.

Broadband, high impedance measurements are typically performed using either an impedance analyzer or a vector network analyzer (VNA). Low frequency impedance analyzers, such as the Keysight E4990A, use an auto-balancing bridge approach for measuring impedance. This impedance analyzer has a measurable impedance up to 40 M$\Omega$ with 10% accuracy and a measurement frequency range spanning 20 Hz to 120 MHz. See Keysight Technologies, "Power of Impedance Analyzer: Comparison to Network Analyzer," Application Note. [Online]. Available: https://www.keysight.com/us/en/assets/7018-04664/application-notes/5992-0338.pdf. While this instrument can measure high impedances, it has the disadvantages of high cost and the inability to measure device transfer functions. Higher frequency impedance analyzers, such as the Keysight E4991B, use an RF I-V approach for measuring impedance. This impedance analyzer can measure impedance up to 52 k$\Omega$ with 10% accuracy and a measurement frequency range spanning 1 MHz to 3 GHz. In general, this instrument does not have the capability to measure high impedances in the Hz and kHz ranges needed for power system device characterization.

Another approach to measuring impedance is to use a low frequency network analyzer, such as the Keysight E5061B or similar, which can be found in many electromagnetics laboratories. The low frequency option for this instrument has a measurement frequency range spanning 5 Hz to 3 GHz and the impedance measurement capability is strongly dependent on the measurement configuration employed. An impedance analysis option is available with this instrument with dedicated connections (gain-phase test port), however, this option does not incorporate fixtures needed to measure large test objects with high impedances.

Series and parallel transmission lines or stubs are commonly used for specific applications such as antenna impedance matching, microwave component design, and filters. Transmission line stubs are commonly mentioned in impedance matching texts; however, practical implementation is not widely provided for series stubs. Parallel transmission lines in the forms of tees are common implementations in microwave circuits, but implementation is often for high frequencies. See D. M. Pozar, *Microwave Engineering*, 3rd ed. Hoboken, NJ: Wiley, 2005; E. H. Kim et al., "Method of improving bandwidth of antenna using transmission line stub," U.S. Pat. No. 10,333,222, Jun. 25, 2019; A. Alexander, "Antenna with series stub tuning," U.S. Pat. No. 7,679,567, Mar. 16, 2010; and A. R. Ellis, "Balanced capacitative type couplers," U.S. Pat. No. 2,826,743, Mar. 11, 1958.

SUMMARY OF THE INVENTION

The present invention is directed to a series tee splitter comprising a primary electromagnetic transmission line and a secondary electromagnetic transmission line that is placed in a series path with the primary electromagnetic transmission line, wherein a load is attached to the end of the secondary electromagnetic transmission line and a network analyzer is connected to opposite ends of the primary electromagnetic transmission line to measure a load impedance. The primary electromagnetic transmission line can comprise a microstrip line structure and the secondary electromagnetic transmission line can comprise a parallel conductor structure built on a T-shaped substrate with the secondary electromagnetic transmission line on the stem of the T-shaped substrate.

BRIEF DESCRIPTION OF THE DRAWINGS

The detailed description will refer to the following drawings, wherein like elements are referred to by like numbers.

FIG. 5A is a graph of the return loss and insertion loss magnitude. FIG. 5B is a graph of the return loss and insertion loss phase.

DETAILED DESCRIPTION OF THE INVENTION

Figure 1:
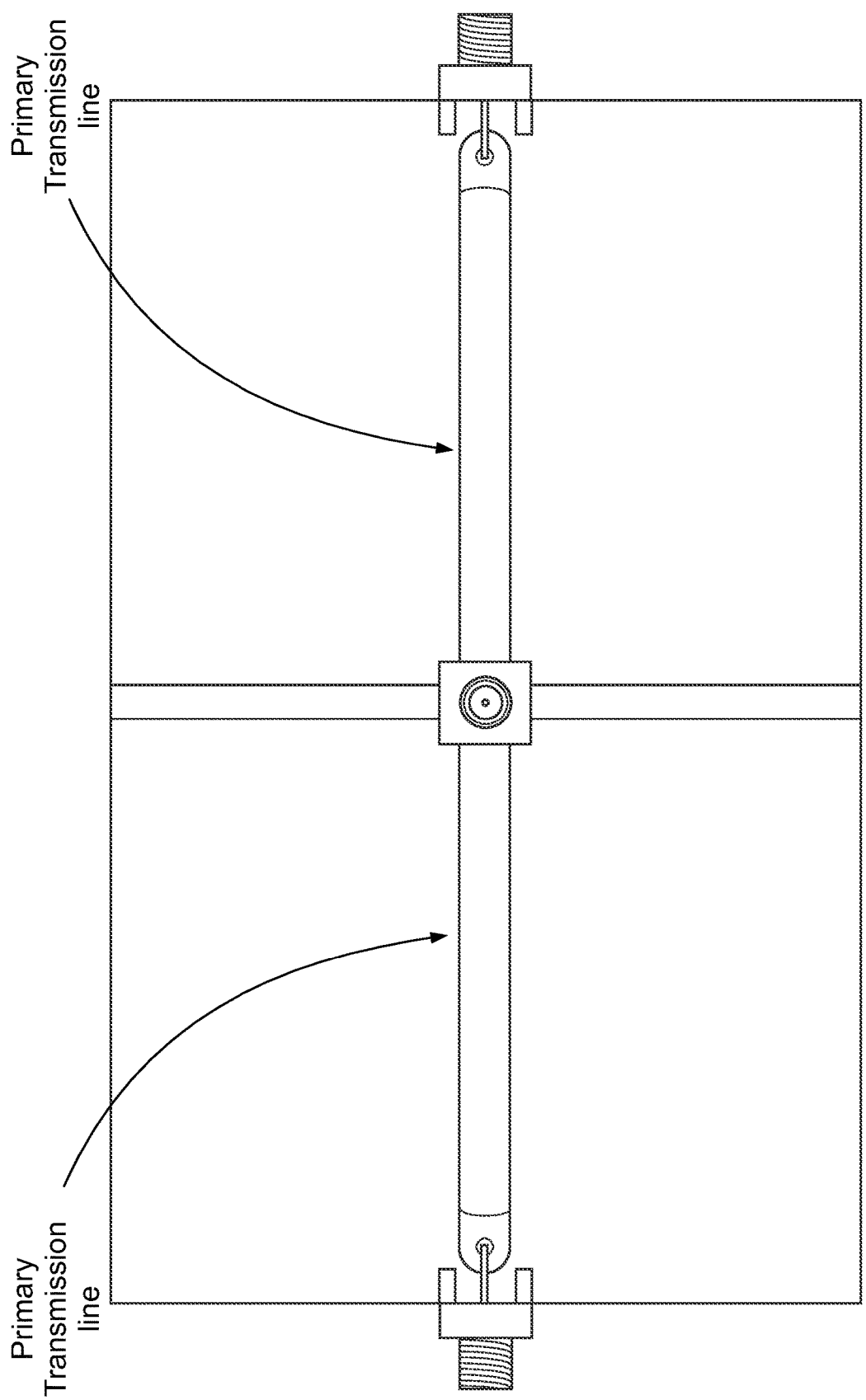
FIG. 1 is a top view photograph of a built series tee splitter.
Figure 2:
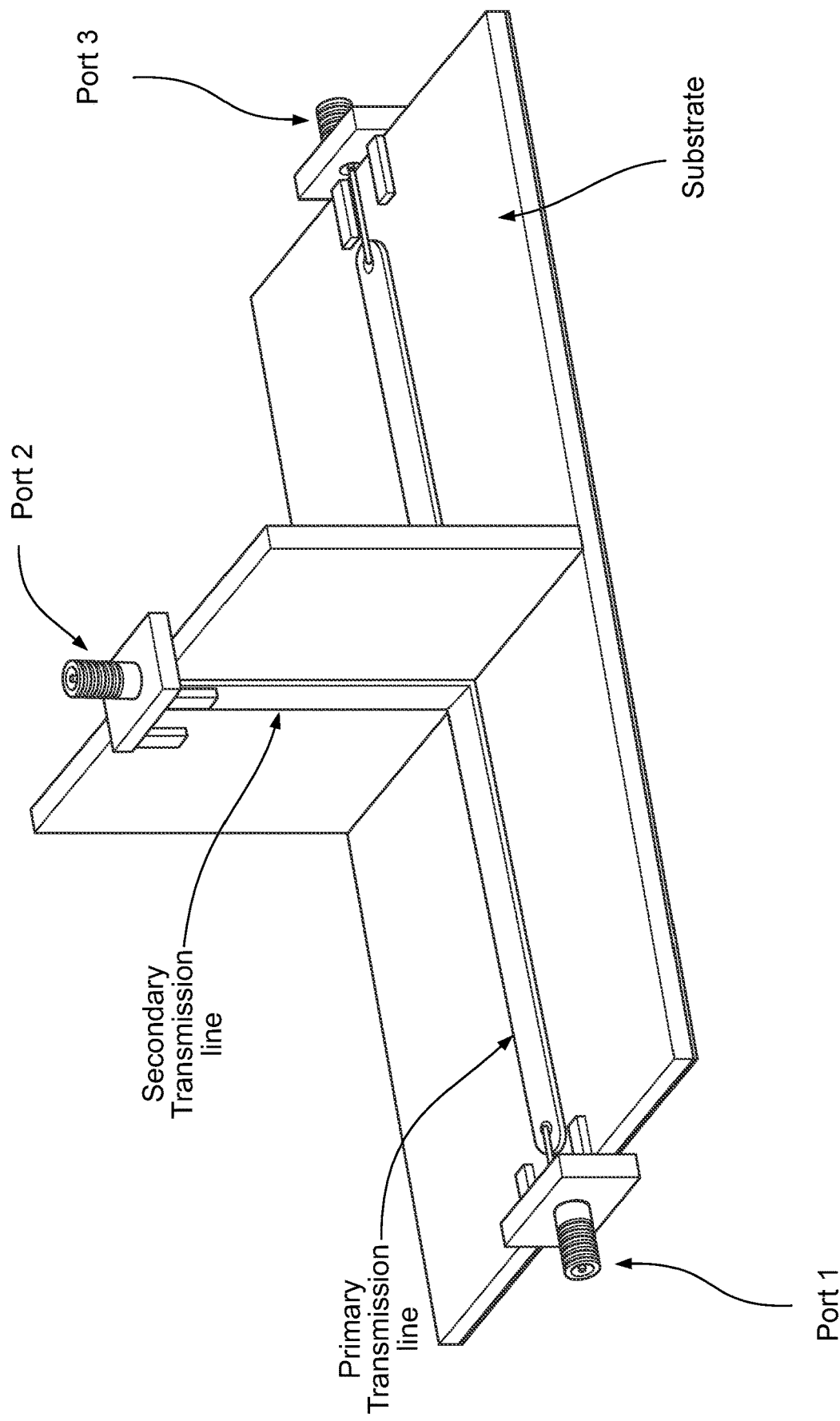
FIG. 2 is a perspective view photograph of the series tee splitter.
Figure 3:
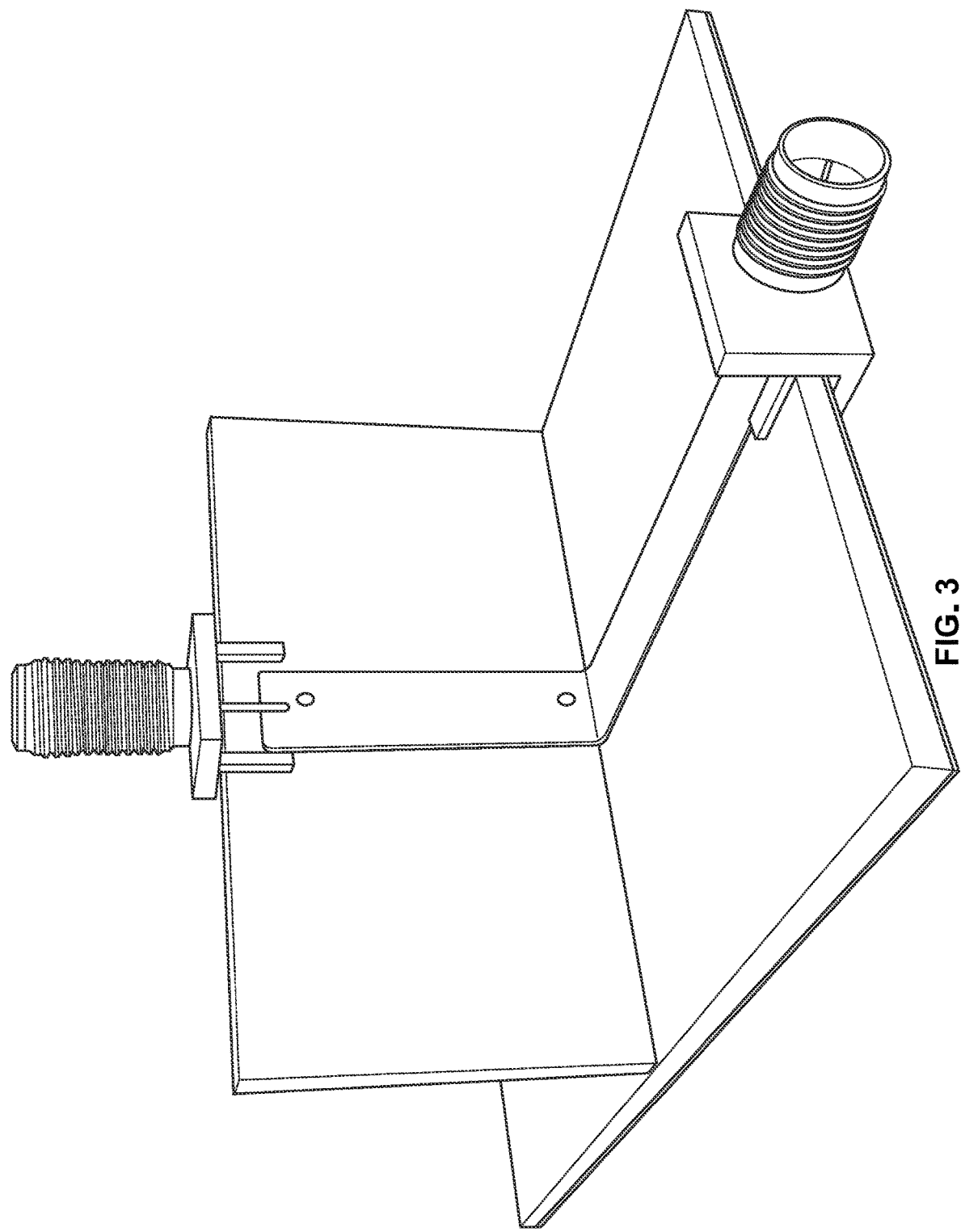
FIG. 3 is an end view photograph of the series tee splitter.
Figure 4:
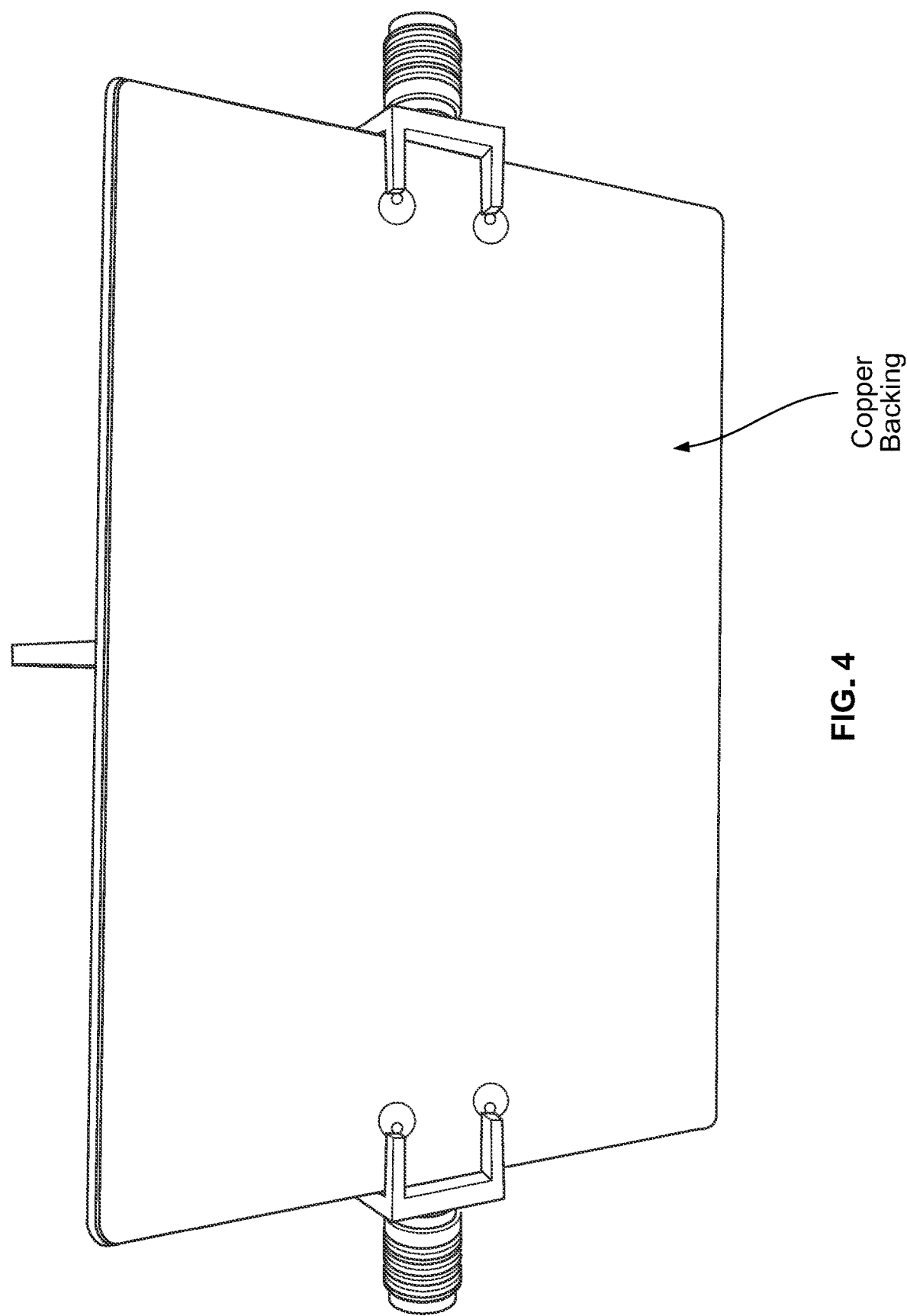
FIG. 4 is a bottom view photograph of the series tee splitter.

An approach to finding the impedance of a test object is to measure the scattering parameters with a VNA and perform a matrix transformation to calculate the impedance. A common approach is to use a 1-port reflection coefficient measurement to extract impedance in an intermediate impedance range, where the governing equation to calculate the impedance is given in equation (1), $$Z_L = Z_0 \frac{1+S_{11}}{1-S_{11}} \quad (1)$$

where $Z_L$ is the load impedance, $Z_0$ is the VNA port reference impedance, and $S_{11}$ is the measured reflection coefficient from the device under test. A limitation of the 1-port measurement is the maximum measurable impedance is governed by the resolution with which the network can measure the magnitude of $S_{11}$, which can have a dynamic range of a few hundred dB and a precision of a few tenths of dB. Measurements on a Keysight E5061B VNA have shown a maximum sensitivity around 100 kΩ with typical measurement settings for this measurement approach.

A 2-port measurement approach can be used to improve the maximum measurable impedance compared to a 1-port measurement with a VNA. When a high impedance is placed in a series path in a 2-port measurement, the impedance can be extracted from the B term in an ABCD-parameter matrix via a matrix transformation of the scattering parameter matrix, or from equation (2), $$Z_L = 2Z_0 \frac{1-S_{21}}{S_{21}} \quad (2)$$

where $S_{21}$ is the measured insertion loss from the 2-port measurement. The limitation of the 2-port measurement for maximum measurable impedance is governed by the minimum measurable insertion loss magnitude. The minimum measurable insertion loss magnitude can range from −100 dB to −120 dB with typical measurement settings. As will be described below, measurements on a Keysight E5061B VNA coupled with the series tee splitter have shown a maximum sensitivity around 10 MΩ at low frequencies with typical measurement settings.

The present invention is directed to a "series tee splitter" which is a 3-port device comprising a primary electromagnetic transmission line and a secondary electromagnetic transmission line that is placed in a series path with the primary electromagnetic transmission line. This configuration allows high impedance loads connected to the secondary transmission line to be placed in a series path with the primary transmission line. The series tee splitter can be electrically small to extract broadband impedance information, rather than at discrete resonance frequencies as with a quarter wave transformer approach. The secondary transmission line can be kept electrically small as well to mitigate impedance transformation effects in the measurement of the high impedance load.

At radio or microwave frequencies, the frequency and wavelength are related to the phase velocity by $$f\lambda = V_p \quad (3)$$

where, f is frequency (Hz), λ is wavelength (m), and $V_p$ is the phase velocity of a wave in the propagating medium (m/s). The phase velocity is given by $$V_p = \frac{1}{\sqrt{\mu\varepsilon}} \quad (4)$$

where, μ is the electrical permeability of the medium and ε is the electrical permittivity of the medium. For the series tee splitter, the phase velocity $V_p$ is relatively constant since μ is equal to the permeability of free space, and the effective permittivity ε is relatively constant at low frequencies for a non-homogenous medium. Therefore, it can be seen in equation (3) that as the frequency increases, the wavelength decreases proportionately. This determines the high frequency range at which the series tee splitter can be used.

The series tee splitter operation is based on fundamental transmission line theory within microwave engineering. As an example, when looking into a lossless transmission line with an attached load, the input impedance is given by $$Z_{in} = Z_0 \frac{Z_L + jZ_0\tan\beta l}{Z_0 + jZ_L\tan\beta l} \quad (5)$$

where $Z_{in}$ is the transmission line input impedance (Ω), $Z_0$ is the transmission line characteristic impedance (Ω), β is the imaginary part of the propagation constant, and l is the transmission line length. β is also related to wavelength as shown in equation (6).

$$\beta = \frac{2\pi}{\lambda} \quad (6)$$

Plugging equation (6) into equation (5) reveals the input impedance equation shown in equation (7).

$$Z_{in} = Z_0 \frac{Z_L + jZ_0\tan\frac{2\pi}{\lambda}l}{Z_0 + jZ_L\tan\frac{2\pi}{\lambda}l} \quad (7)$$

From equation (7), if the length of the transmission line is kept small relative to wavelength, termed "electrically small", equation (7) will simplify to equation (8).

$$Z_{in} \approx Z_L \text{ for } l \ll \lambda \quad (8)$$

As a practical matter, engineers often use an approximate criterion that the transmission line length l be smaller than ¹⁄₁₀ an operating wavelength, which equates to a phase progression less than 36 degrees. For $$l \le \frac{\lambda}{10}$$

at a given frequency, then the length can be considered electrically small. Otherwise, the length can be considered electrically large. Equation (8) is relied upon for high impedance measurement applications using the series tee splitter and the associated network parameter theory math with ABCD-parameters. Thus, this type of measurement also relies on the electrically small condition being met. If this criterion is not met, the splitter can still be used, but additional data processing is needed to extract the desired information.

As an example of the invention, a series tee splitter was built to enable improved, high impedance measurements on large test articles with a VNA over the early-time bandwidth (~100 MHz) of a conducted HEMP environment. The series tee splitter can be constructed using inexpensive materials to enable 2-port high impedance measurements. The primary transmission line can comprise a microstrip line structure formed with copper tape strips on a copper-backed, thin, low dielectric constant substrate, such as acrylonitrile butadiene styrene (ABS) plastic. The ABS plastic substrate can be 3D printed in the shape of a "T". The secondary transmission line can comprise a parallel conductor structure created with parallel copper tape strips on the stem of the T-shaped ABS plastic substrate. The ABS plastic thicknesses for each transmission line structure as well as the trace widths can be tailored to allow the use of commercial printed circuit board (PCB) connectors at the ends of the transmission lines. For example, edge-mount SubMiniature version A (SMA) PCB connectors can be used to interface with the primary and secondary transmission line structures. In the exemplary series tee splitter, the base SMA connectors interfacing with the primary transmission line were 132255-11 Amphenol RF connectors, and the top SMA connector interfacing with the secondary transmission line was an 132289 Amphenol RF connector. The line widths can be designed to form 50Ω characteristic impedance transmission line structures to minimize wave reflections in a 50Ω measurement system. However, the series tee splitter can be designed to be used with other characteristic impedances (e.g., 75Ω). In addition, the line widths can be designed to be the same for both the primary and secondary transmission lines so that the inductive discontinuity at the transmission line junction is minimized. The line widths of the exemplary splitter were 228.7 mils, where 1 mil is ¹⁄₁₀₀₀ of an inch. Line lengths can also be kept small to maximize the splitter useable bandwidth. For the exemplary splitter, the base dimensions of the substrate were 2000 mils wide×3000 mils long×80 mils thick. The top stem dimensions of the substrate were 2000 mils wide×1000 mils high×60 mils thick. A potential limiting factor for the impedance calculation and measurement with the series tee splitter is the capacitance of the secondary transmission line. Minimization of this capacitance improves the measurement sensitivity. The ABS plastic substrate has a low dielectric constant (relative permittivity of 2.3-2.6). This low dielectric constant reduces some of the limiting capacitance, extends the upper frequency range due to the electrical length limitation, and enhances mechanical rigidity with a solid dielectric substrate. Dielectrics with a larger relative permittivity can be used as the substrate material, but the splitter would need to be physically smaller to keep the splitter electrically small over a broad bandwidth. Photographs of the exemplary series tee splitter are shown in FIGS. 1-4. The continuous T-shaped substrate enables the formation of primary and secondary transmission line structures. The shape of the splitter does not necessarily need to be a "T", but this is a convenient geometry which can easily be put into an enclosure. Further, the secondary transmission line is placed in the middle of the primary transmission line for simplicity and convenience in the exemplary series tee splitter. However, a different placement can be used if desired.

Scattering parameters for the exemplary series tee splitter were first calculated from a sequence of scattering parameter measurements with known loads for initial performance characterization. For these measurements, Port 1 and Port 3 were assigned to the main transmission line and Port 2 was assigned to the secondary transmission line. The generalized scattering parameters describing the wave propagation in the series tee splitter are given in a general form with equation (9), $$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix} \quad (9)$$

where $a_k$ is the incident wave and $b_k$ is the reflected wave measured at port k.

Figure 5A:
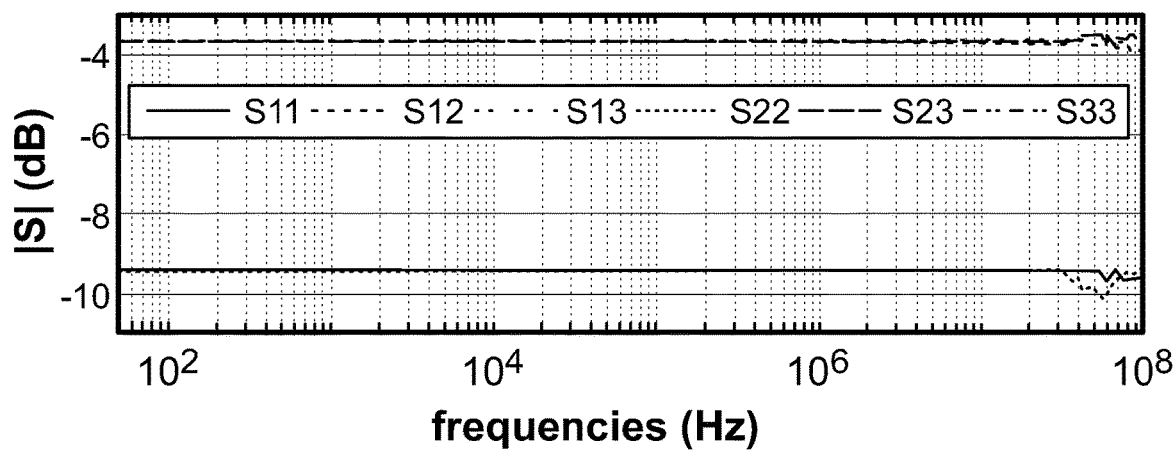
FIGS. 5A and 5B are graphs of scattering parameters calculated from a sequence of load measurements with a VNA for a series tee splitter.
Figure 5B:
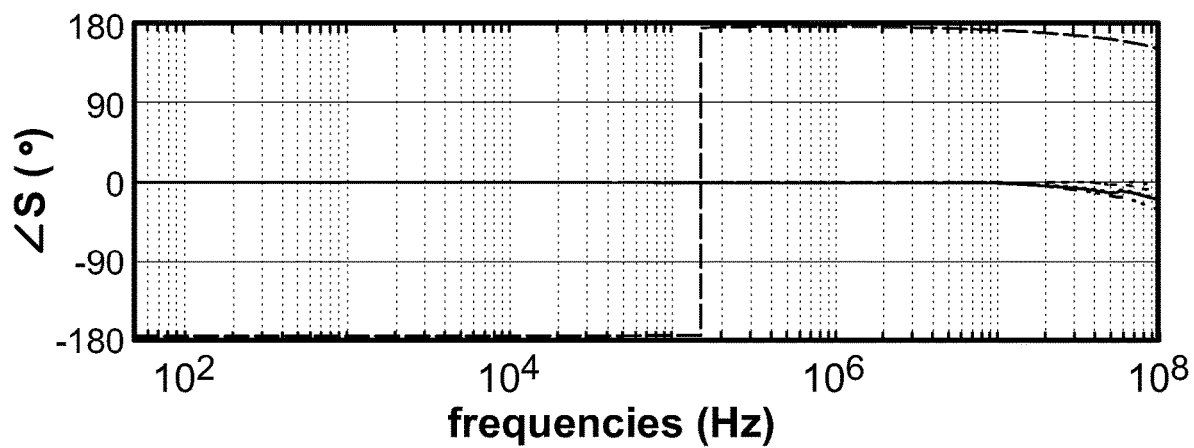

The results from these measurements are shown in FIGS. 5A and 5B. For the measurements shown, Port 1 and Port 3 were assigned to the primary transmission line and Port 2 was assigned to the secondary transmission line. The maximum phase progression was 22 degrees and 17 degrees for the $S_{31}$ and $S_{21}$ parameters at 100 MHz, respectively. Thus, the measured phase progression indicates the series tee splitter can be considered electrically small at least up to 100 MHz. The flat return loss and insertion loss responses also enable simple lumped circuit models to be used for the series tee splitter.

Figure 6:
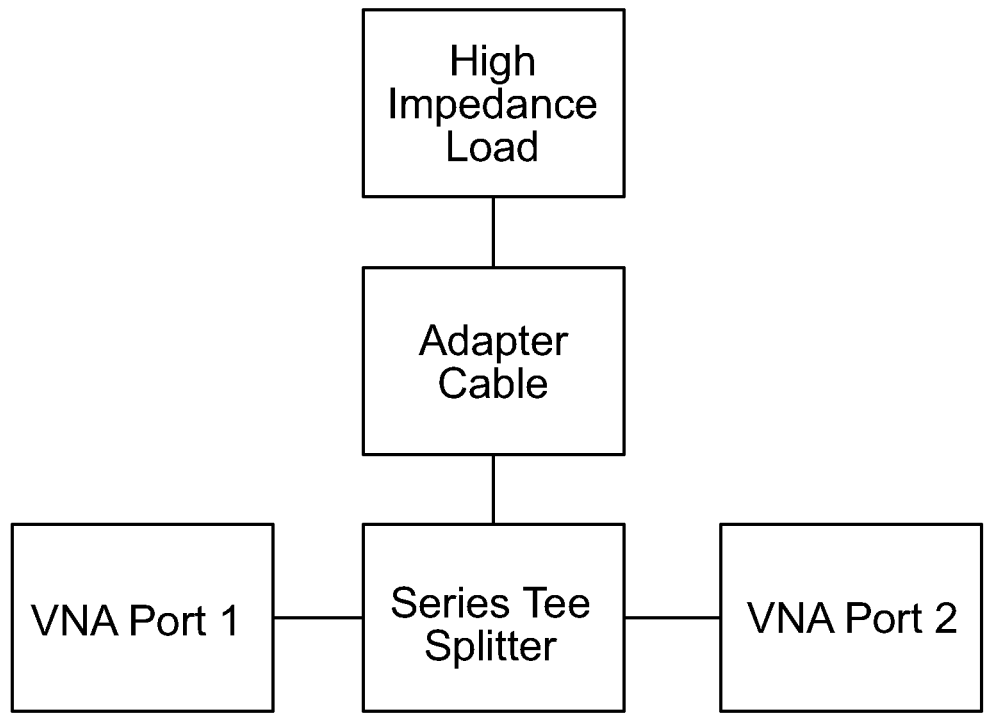
FIG. 6 is a block diagram of a high impedance measurement with the series tee splitter.
Figure 7:
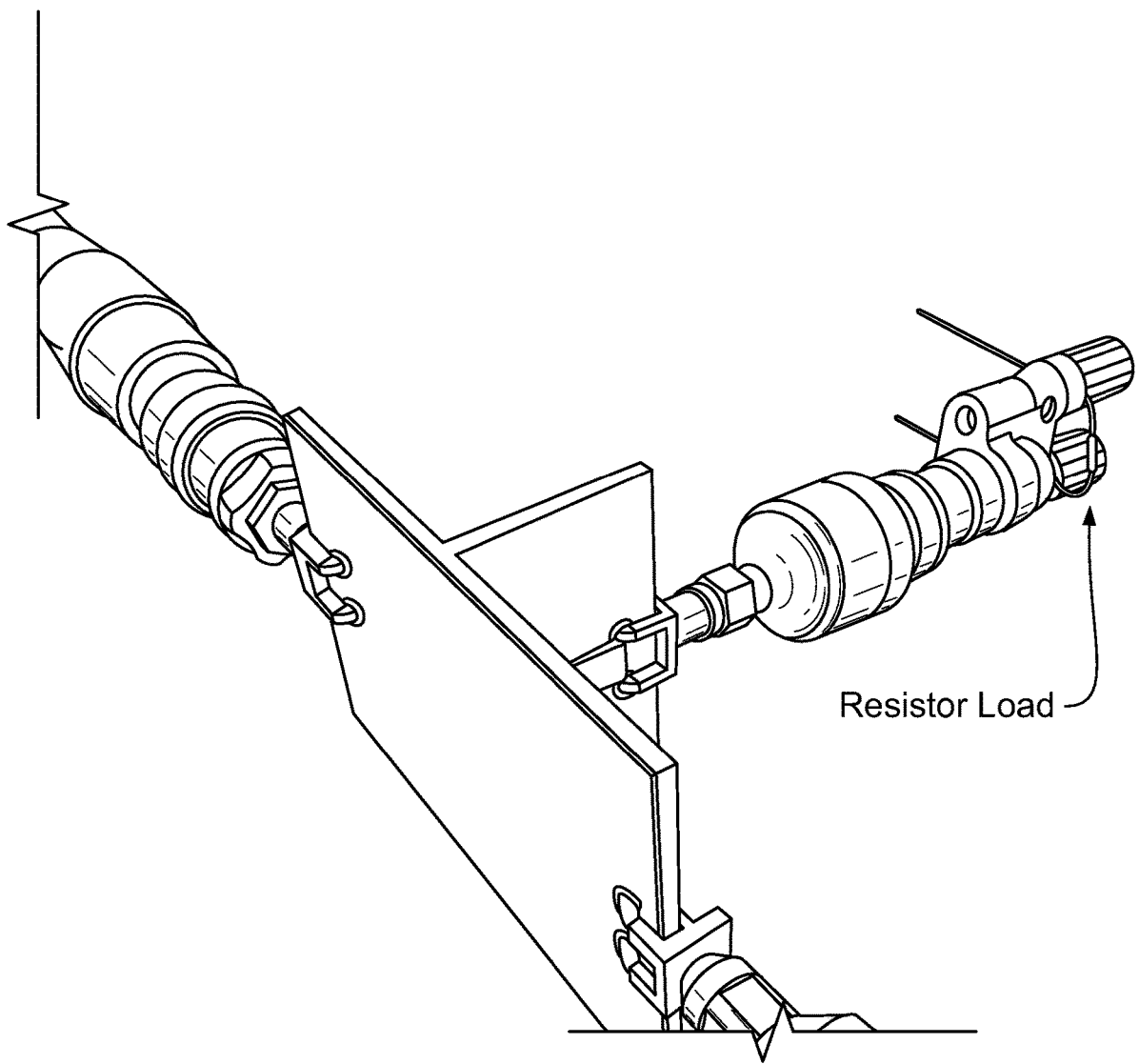
FIG. 7 is a photograph of the series tee splitter with a resistor in connection Breakout 1.
Figure 8:
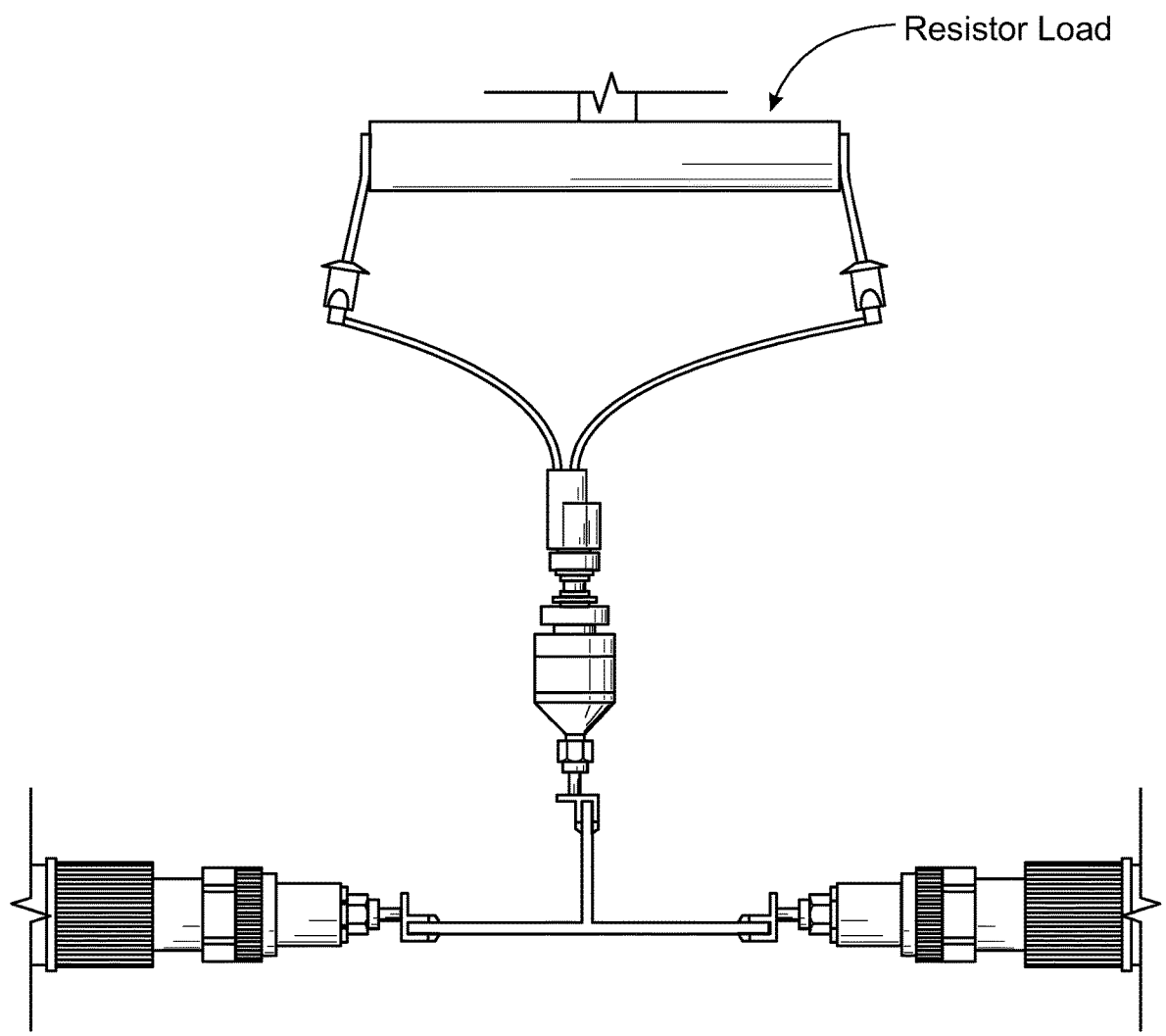
FIG. 8 is a photograph of the series tee splitter with a resistor in connection Breakout 2.

Impedance measurements were also performed for varying sizes of resistors, an open load fixture, and a capacitive "open" cap to illustrate the performance of the series tee splitter. A block diagram of the measurement setup is shown in FIG. 6. A high impedance load was connected to the secondary transmission line port using connector adapters and additional wiring for these measurements. When making high impedance measurements at low frequencies, the return conductor of the series port associated with the secondary transmission line was isolated from the return conductors on either of the main transmission line ports to ensure proper measurements. A vector network analyzer was connected to the opposing ports of the primary transmission line (labeled VNA Port 1 and VNA Port 2 in FIG. 6). Pictures of the resistor load connections for Breakouts 1 and 2 are shown in FIGS. 7 and 8, respectively. The resistor values measured in Breakout 1 based on DC multimeter measurements were 52Ω, 105.5Ω, 510Ω, 1.498 kΩ, and 11.15 kΩ The resistor values measured in Breakout 2 based on DC multimeter measurements were 99.4 kΩ and 24.4 MΩ.

Figure 9A:
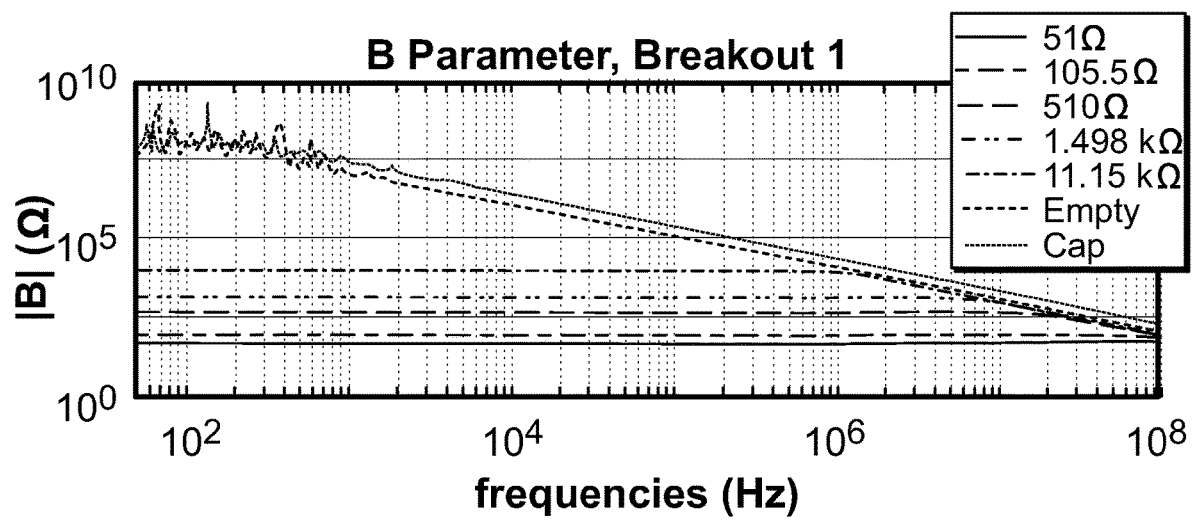
FIGS. 9A and 9B are graphs of a two-port resistor impedance measurement using the series tee splitter in connection Breakout 1.
Figure 9B:
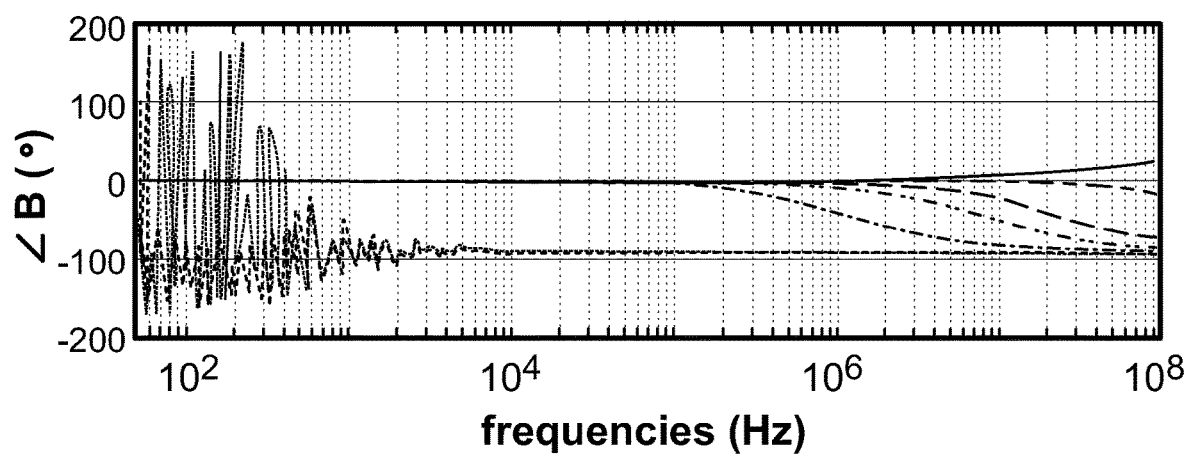
Figure 10A:
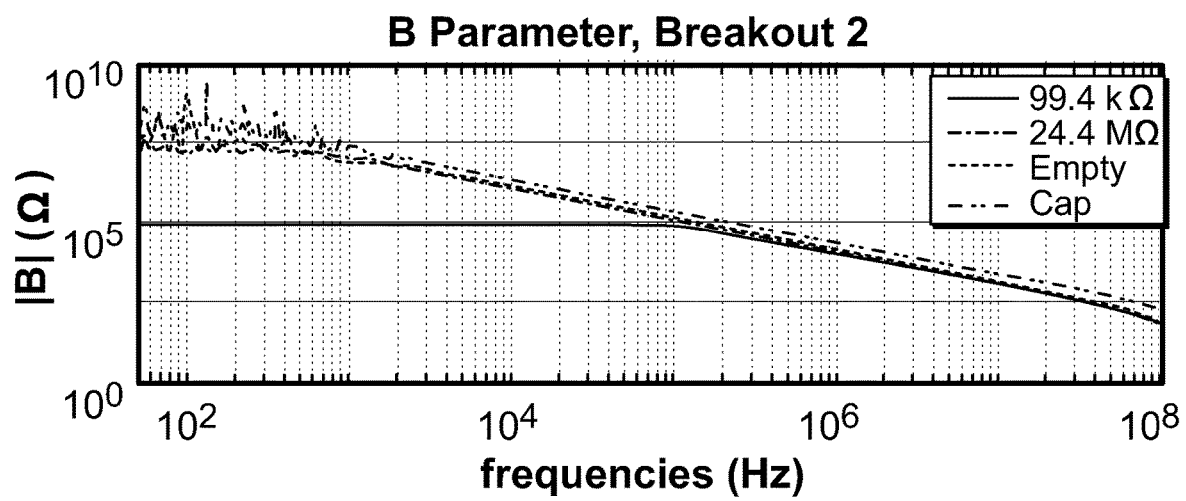
FIGS. 10A and 10B are graphs of a two-port resistor impedance measurement using the series tee splitter in connection Breakout 2.
Figure 10B:
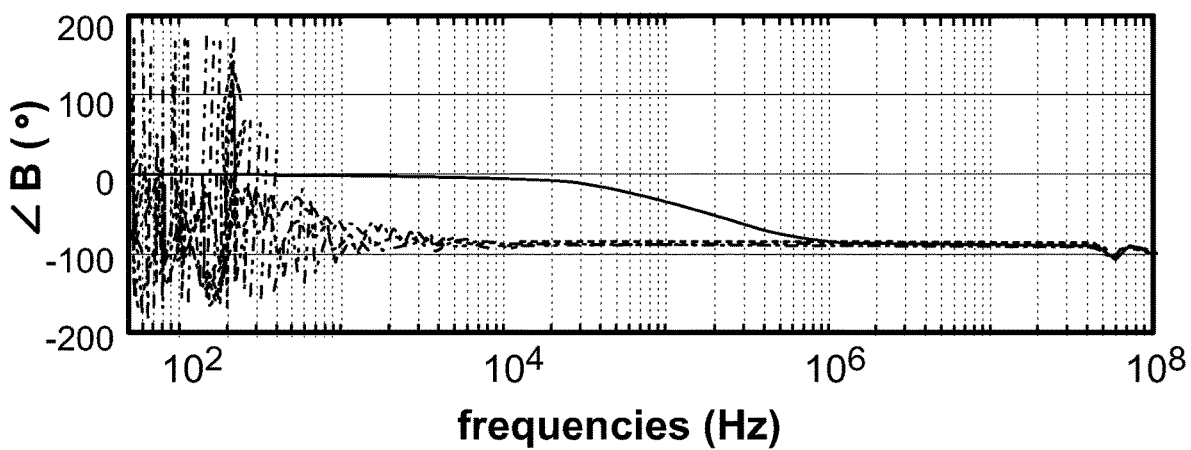
Figure 11A:
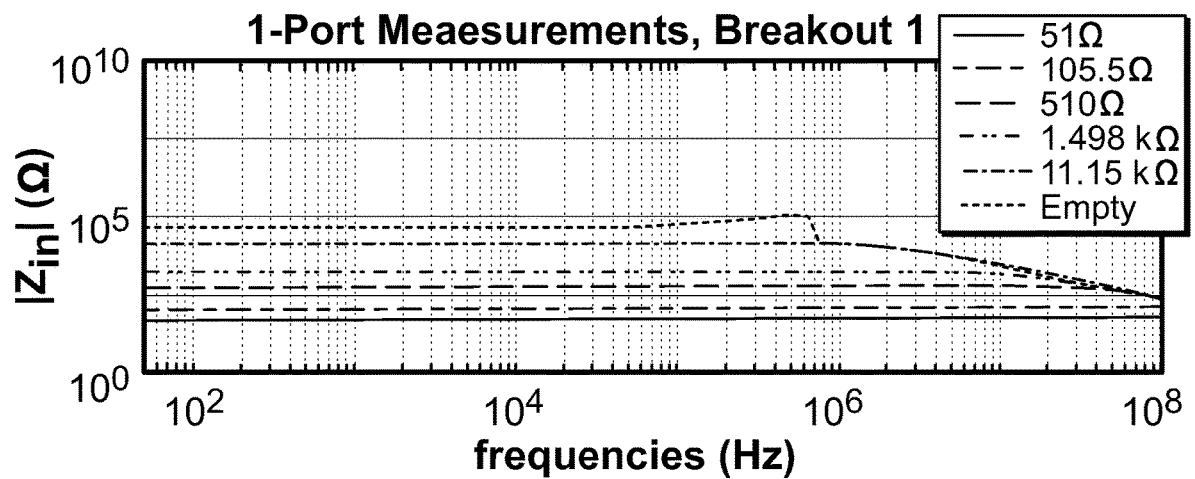
FIGS. 11A and 11B are graphs of a one-port resistor impedance measurement using connection Breakout 1.
Figure 11B:
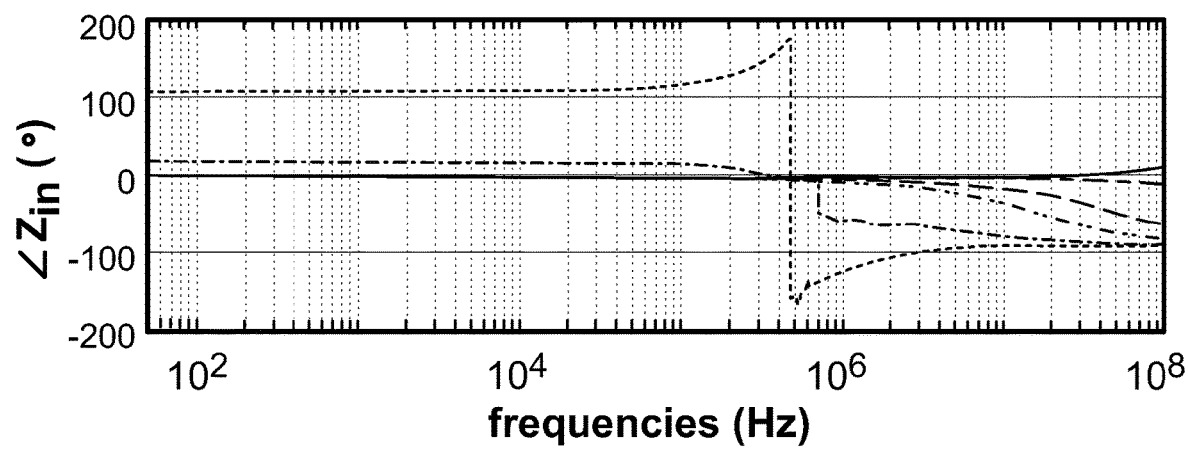

Results from these 2-port measurements are shown in FIGS. 9A-B and 10A-B for Breakouts 1 and 2, respectively. FIGS. 9A and 10A show the magnitude and FIGS. 9B and 10B show the phase of the B-parameter in the ABCD-parameter matrix for the 2-port network. The relationship among the port voltages, port currents, and B-parameter in an ABCD-parameter matrix formulation is shown in equation (10).

$$\begin{bmatrix} V_1 \\ I_1 \end{bmatrix} = \begin{bmatrix} A & B \\ C & D \end{bmatrix} \begin{bmatrix} V_2 \\ I_2 \end{bmatrix} \quad (10)$$

Figure 12A:
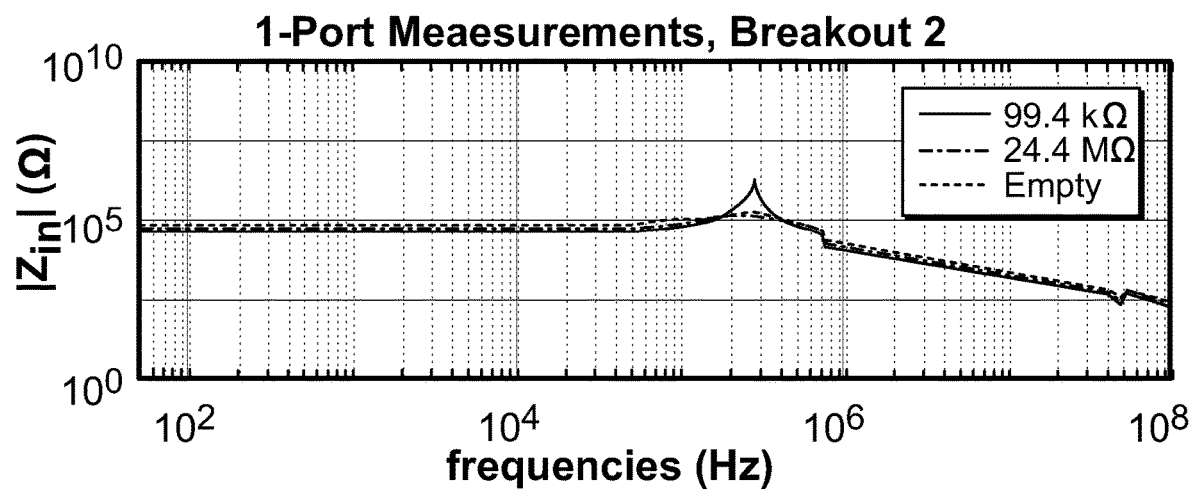
FIGS. 12A and 12B are graphs of a one-port resistor impedance measurement using connection Breakout 2.
Figure 12B:
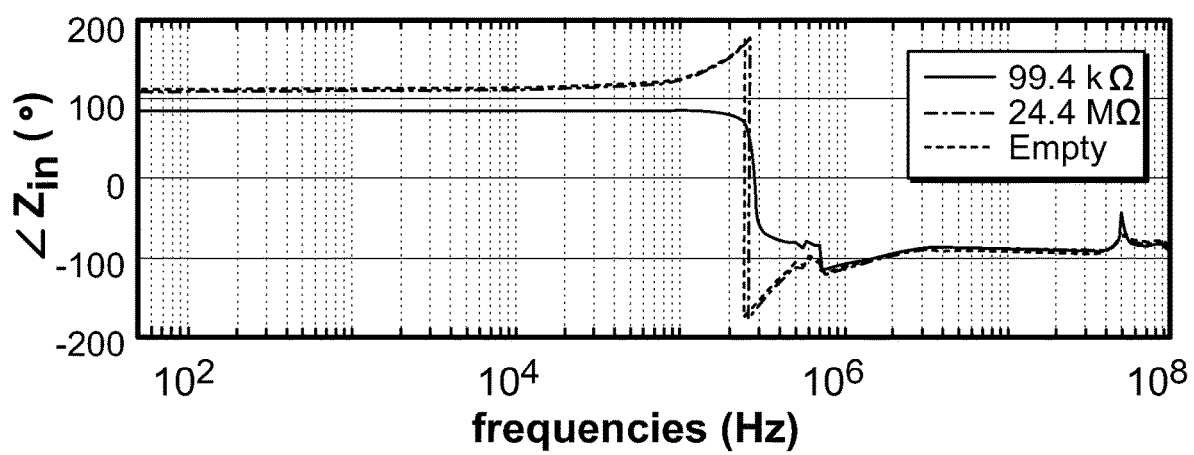

$V_1$ is port 1 total voltage, $I_1$ is port 1 total current, $V_2$ is port 2 total voltage, $I_2$ is port 2 total current, and elements A, B, C, and D are parameters within the ABCD-parameter matrix. The B-parameter in equation (10) represents the series impedance in the test circuit and is equivalent to the formulation given in equation (2). FIGS. 9A, 9B, 10A, and 10B illustrate the upper bound of a measurable impedance is around 10 MΩ at low frequencies, where at high frequencies the impedance measurement is limited by the capacitance of the series tee splitter and the load. One-port measurements were also performed as a comparison for the measurement connection breakouts of FIGS. 7 and 8, as shown in FIGS. 11A-B and 12A-B, respectively. FIG. 12A shows that the maximum measurable impedance magnitude is limited to around 100 kΩ with typical measurement settings for a 1-port measurement.

The low frequency impedance measurements possible with the series tee splitter enable deeper interrogation of devices. The connectorized form allows the series tee splitter to be used for general purpose measurements. The series tee splitter can be used for general high impedance measurements, material characterization measurements (e.g., permittivity characterization), and applications where sources are desired in a series path. High impedances can be measured with the series tee splitter on a similar scale as commercially available low frequency impedance analyzers, but at a much lower cost using existing laboratory equipment infrastructure. The series tee splitter can be used with low frequency vector network analyzers or other instrumentation readily available in many electromagnetics labs. The series tee splitter is particularly suitable for measurements with large test components that can't be placed directly in a series path with a main transmission line for high impedance measurements. The portability of the series tee splitter is important for in the field measurements on large test articles, where the splitter and a vector network analyzer can be used for impedance and transfer function measurements. Without this splitter, an impedance analyzer and a network analyzer may be required for these measurements.

The present invention has been described as a series tee splitter for impedance measurements. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A series tee splitter, comprising a primary electromagnetic transmission line having a first port and a third port at opposite ends of the primary transmission line, and a secondary electromagnetic transmission line having a second port that is placed in a series path with the primary electromagnetic transmission line, wherein a load is attached to the second port of the secondary electromagnetic transmission line and a network analyzer is connected to the first port and the third port of the primary electromagnetic transmission line to measure an impedance of the load.

2. The series tee splitter of claim 1, wherein the primary electromagnetic transmission line comprises a microstrip line structure and the secondary electromagnetic transmission line comprises a parallel conductor structure built on a T-shaped substrate with the secondary electromagnetic transmission line on the stem of the T-shaped substrate.

3. The series tee splitter of claim 1, wherein the primary and secondary electromagnetic transmission lines have a 50-Ω characteristic impedance.

4. The series tee splitter of claim 2, wherein the substrate comprises a low permittivity material.

5. The series tee splitter of claim 4, wherein the substrate has a relative permittivity of less than 10.

6. The series tee splitter of claim 4, wherein the low permittivity material comprises acrylonitrile butadiene styrene.

7. The series tee splitter of claim 1, wherein the network analyzer comprises a vector network analyzer or scalar network analyzer.

8. The series tee splitter of claim 1, wherein the load impedance can be up to 10 MΩ at a measurement frequency range from 5 Hz to 1 kHz.

\* \* \* \* \*